United States Patent [19]

Matsui

[11] Patent Number: 5,473,576
[45] Date of Patent: Dec. 5, 1995

[54] DYNAMIC RANDOM ACCESS MEMORY DEVICE WITH LOW-POWER CONSUMPTION COLUMN SELECTOR

[75] Inventor: Yoshinori Matsui, Tokyo, Japan

[73] Assignee: NEC Corporation, Tokyo, Japan

[21] Appl. No.: 281,278

[22] Filed: Jul. 27, 1994

[30] Foreign Application Priority Data

Jul. 27, 1993 [JP] Japan .................. 5-184285

[51] Int. Cl.⁶ .................................. G11C 11/34
[52] U.S. Cl. .............. 365/230.06; 365/207; 365/203; 365/204; 365/227; 365/190; 365/175; 365/149
[58] Field of Search ................. 365/227, 228, 365/203, 207, 208, 175, 189.09, 190, 204, 230.06, 149

[56] References Cited

U.S. PATENT DOCUMENTS 5,084,842  1/1992  Tsuchida et al. .............. 365/203 X
5,245,582  9/1993  Kubota ........................ 365/207
5,274,595 12/1993  Seok et al. ................... 365/203
5,283,760  2/1994  Chin et al. .................. 365/203 X
5,295,094  3/1994  Miyatake ..................... 365/182

FOREIGN PATENT DOCUMENTS 62-250595 10/1987 Japan .
1147915  6/1989 Japan .

*Primary Examiner*—David C. Nelms
*Assistant Examiner*—Huan Hoang
*Attorney, Agent, or Firm*—Sughrue, Mion, Zinn, Macpeak & Seas

[57] ABSTRACT

A column selector of a dynamic random access memory device is implemented by a plurality of switching circuits for transferring a potential difference from a sense amplifier to a shared data line pair, and one of the switching circuits selectively discharge the data lines of the pair to a ground voltage line for transferring the potential difference to the shared data line pair, wherein a potential control circuit is coupled between the switching circuits and the ground voltage line for decreasing the current flowing from the data line to the ground voltage line after production of an output data signal, thereby decreasing the current consumption.

5 Claims, 4 Drawing Sheets

1

DYNAMIC RANDOM ACCESS MEMORY DEVICE WITH LOW-POWER CONSUMPTION COLUMN SELECTOR

FIELD OF THE INVENTION

This invention relates to a dynamic random access memory device and, more particularly, to a dynamic random access memory device having a low-power consumption column selector for transferring a potential difference on a selected bit line pair to a data line pair.

DESCRIPTION OF THE RELATED ART

A typical example of the dynamic random access memory device is illustrated in FIG. 1 of the drawings, and the prior art dynamic random access memory device largely comprises a first memory cell array 1, a second memory cell array 2, an array of sense amplifier circuits SA1 to SAn shared between the first and second memory cell arrays 1 and 2, a first transfer gate array 3 associated with the first memory cell array 1, a second transfer gate array 4 associated with the second memory cell array 2, a column selector 5 for selectively coupling the sense amplifier circuits SA1 to SAn through a data line pair DL to a data amplifier circuit 6 and a charging circuit 7 for the data line pair DL. Although the prior art dynamic random access memory device further comprises a write-in circuit etc., FIG. 1 does not show these circuits, because they are less important for understanding problems inherent in the prior art dynamic random access memory device.

The first memory cell array 1 is implemented by a plurality of memory cells for storing data bits in the form of potential difference, and the memory cells are indicated by small circles. A plurality of bit line pairs BLa1, BLa2, . . . and BLan are selectively coupled with the input/output nodes of the memory cells, and word lines WLa are further selectively coupled to the control nodes of the memory cells. The word lines WLa are selectively driven to an active level, and the stored data bits are transferred from the associated memory cells to the bit line pairs BLa1 to BLan.

The second memory cell array 2 is also arranged. Namely, a plurality of memory cells form a matrix, and are selectively coupled to a plurality of word lines WLb1/WLb2 and a plurality of digit line pairs BLb1, BLb2, . . . and BLbn. If one of the word lines such as WLb1 is energized, the associated memory cells delivers the stored data bits to the bit line pairs, respectively.

The first transfer gate array 3 has a plurality of sets of n-channel enhancement type transfer transistors Qn1/Qn2 coupled between the bit line pairs BLa1 to BLan and the sense amplifier circuits SA1 to SAn, and a first transfer signal TG1 causes the n-channel enhancement type transfer transistors Qn1/Qn2 to concurrently turn on for coupling the sense amplifier circuits SA1 to SAn to the digit line pairs BLa1 to BLan.

Similarly, a plurality of sets of n-channel enhancement type transfer transistors Qn3/Qn4 form the second transfer gate array 4, and a second transfer signal TG2 concurrently changes the n-channel enhancement type transfer transistors Qn3/Qn4 between on-state and off-state so as to couple the sense amplifier circuits SA1 to SAn to the digit line pairs BLb1 to BLbn.

The sense amplifier circuits SA1 to SAn are operative to rapidly develop potential differences at the input/output nodes thereof, and the arrangement of each sense amplifier is well know to a person skilled in the art.

The column selector unit 5 comprises a plurality of switching circuits 51 to 5n respectively associated with the sense amplifier circuits SA1 to SAn, and each of the switching circuits 51 to 5n has a first parallel combination of n-channel enhancement type switching transistors Qn5/Qn6 coupled to the data line pair DL and a second parallel combination of n-channel enhancement type switching transistors Qn7/Qn8 coupled between the first parallel combination and a discharging line DSC. Column address decoded signals Y1 to Yn are distributed to the switching circuits 51 to 5n, and the n-channel enhancement type switching transistors Qn5/Qn6 are gated by one of the column address decoded signals Y1 to Yn. The gate electrodes of the n-channel enhancement type switching transistors Qn7 and Qn8 are coupled to the pair of input/output nodes of the associated sense amplifier circuit SA1, SA2, . . . or SAn. If the column address decoded signals Y1 to Yn enable the switching circuit 51, the n-channel enhancement type switching transistors Qn5 and Qn6 turn on, and the input/output nodes of the sense amplifier circuit SA1 causes the n-channel enhancement type switching transistors Qn7/Qn8 to selectively turn on and off. As a result, one of the data lines of the pair DL is coupled through the switching circuit 51 to the discharging line DSC, and the potential difference between the input and output nodes of the sense amplifier circuit SA1 is relayed to the data line pair DL.

The charging circuit 7 is implemented by a parallel combination of p-channel enhancement type charging transistors Qp9 and Qp10, and the p-channel enhancement type charging transistors Qp9 and Qp10 are coupled between a power voltage line Vcc and the data lines of the pair DL. The gate electrodes of the p-channel enhancement type charging transistors Qp9 and Qp10 are coupled to the drain nodes, and are maintained in the on-state at all times. For this reason, the data lines are charged to a predetermined level lower than the power voltage level Vcc by the threshold of the p-channel enhancement type charging transistors Qp9 and Qp10 before the column address decoded signals Y1 to Yn select one of the switching circuits 51 to 5n.

Assuming now that a data bit stored in the memory cell MCx is accessed, the bit line pairs BLa1 to BLan and BLb1 to BLbn have been already charged to a precharge level. For the sake of simplicity, description is hereinbelow focused on the second memory cell array 2.

The row address bits are decoded, and the word line WLb1 is changed to the active level. The memory cells coupled to the word line WLb1 deliver the data bits to the associated bit line pairs BLb1 to BLbn, respectively, and produce potential differences on the associated bit line pairs BLb1 to BLbn, respectively.

The transfer signal TG2 is changed to the active high voltage level, and the other transfer signal TG1 remains low. As a result, the n-channel enhancement type transfer transistors Qn3 and Qn4 turn on, and the n-channel enhancement type transfer transistors Qn1 and Qn2 are maintained in the off-state. Then, the potential differences on the bit line pairs BLb1 to BLbn are propagated to the sense amplifier circuits SA1 to SAn, respectively.

The sense amplifier circuits SA1 to SAn are activated so as to rapidly develop the potential differences. The n-channel enhancement type transfer transistors Qn3 and Qn4 are assumed to propagate a high voltage level and a low voltage level, respectively.

The column address decoded signal Y1 allows the n-channel enhancement type switching transistors Qn5/Qn6 of the switching circuit 51 to turn on, and the other column address decoded signals keep the other n-channel enhancement type switching transistors Qn5/Qn6 of the other switching circuits 52 to 5n off. For this reason, the switching circuit 51 becomes responsive to the potential difference supplied from the sense amplifier circuit SA1. The potential difference indicative of the data bit read out from the memory cell MCx allows the n-channel enhancement type switching transistor Qn7 to produce a conductive channel from the data line to the discharging line DSC and the other n-channel enhancement type switching transistor Qn8 to block the other data line from the discharging line DSC. As a result, the data line coupled to the p-channel enhancement type charging transistor Qp9 becomes lower than the other data line coupled to the p-channel enhancement type charging transistor Qp10.

In this instance, the column address decoded signal Y1 does not affect the behavior of the switching circuit 51, and the column address decoder (not shown) can drive the column address decoded signals Y1 to Yn upon activation of the sense amplifier circuits SA1 to SAn. This results in acceleration of the data access.

However, a problem is encountered in the prior art dynamic random access memory device in large current consumption. The large current consumption is derived from the selected switching circuit 51, 52, ... or 5n continuously discharging the data line until the column address decoded signals selects another switching circuit. As a result, while an external device (not shown) is accessing data bits stored in the prior art dynamic random access memory device, current continuously flows from one of the p-channel enhancement type charging transistors Qp9 and Qp10 through the associated data line and the selected switching circuit to the discharging line DSC.

The prior art dynamic random access memory device commercially available has more than one pair of memory cell arrays. For example, a memory cell arrays 11 to 1m and m+1 sense amplifier/column selector units 20 to 2m are alternately arranged as shown in FIG. 2. In order to decrease the current consumption, the memory cell arrays 11 to 1m and the sense amplifier/column selector units 20 to 2m are partially activated for a data access. If the prior art dynamic random access memory device enables a quarter of the memory cells, the memory cell arrays 12, 16, . . . and the associated sense amplifier/column selector units 21, 22, 25, 26, . . . are activated, and the activated memory cells and the sense amplifier/column selector units are hatched for better understanding. Although the bit line pairs of the activated memory cell arrays are precharged before a data access, the other bit line pairs are not precharged, and the dynamic random access memory device is expected to drastically decrease the current consumption.

However, a column address decoder 30 is shared between the column selectors, and a substantial amount of current is consumed by the switching circuits of the activated column selectors. Therefore, the problem is serious for a dynamic random access memory device with a large number of memory cell arrays.

If the column address decoder retards the selection of the switching circuits 51 to 5n, the current consumption is decreased. However, the data access becomes slow.

SUMMARY OF THE INVENTION

It is therefore an important object of the present invention to provide a dynamic random access memory device which is reduced in current consumption without sacrifice of data access speed.

To accomplish the object, the present invention proposes to vary resistance against current from a pair of second data lines.

In accordance with the present invention, there is provided a semiconductor memory device comprising: a) a plurality of addressable memory cells for storing data bits; b) a plurality pairs of first data lines selectively coupled to the plurality of addressable memory cells; c) a first addressing system for selectively connecting the plurality of addressable memory cells to the plurality pairs of first data lines; d) second data lines paired with each other; e) a charging circuit coupled to the second data lines for supplying current thereto; f) a discharging line for discharging the current; g) a second addressing system having a plurality of switching circuits coupled in parallel between the second data lines and the discharging line, one of the plurality of switching circuits being responsive to a data bit on one of the plurality pairs of first data lines for selectively connecting the second data lines to the discharging line, thereby transferring the data bit to the second data lines in the form of potential difference; h) an interface responsive to the data bit on the second data lines for producing a data signal; and i) a current control means coupled between the discharging line and a voltage source, and increasing the current flowing from the discharging line to the voltage source for enlarging the potential difference between the second data lines before the interface produces the data signal, the current control means decreasing the current after completion of the production of the data signal.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENT

Figure 1:
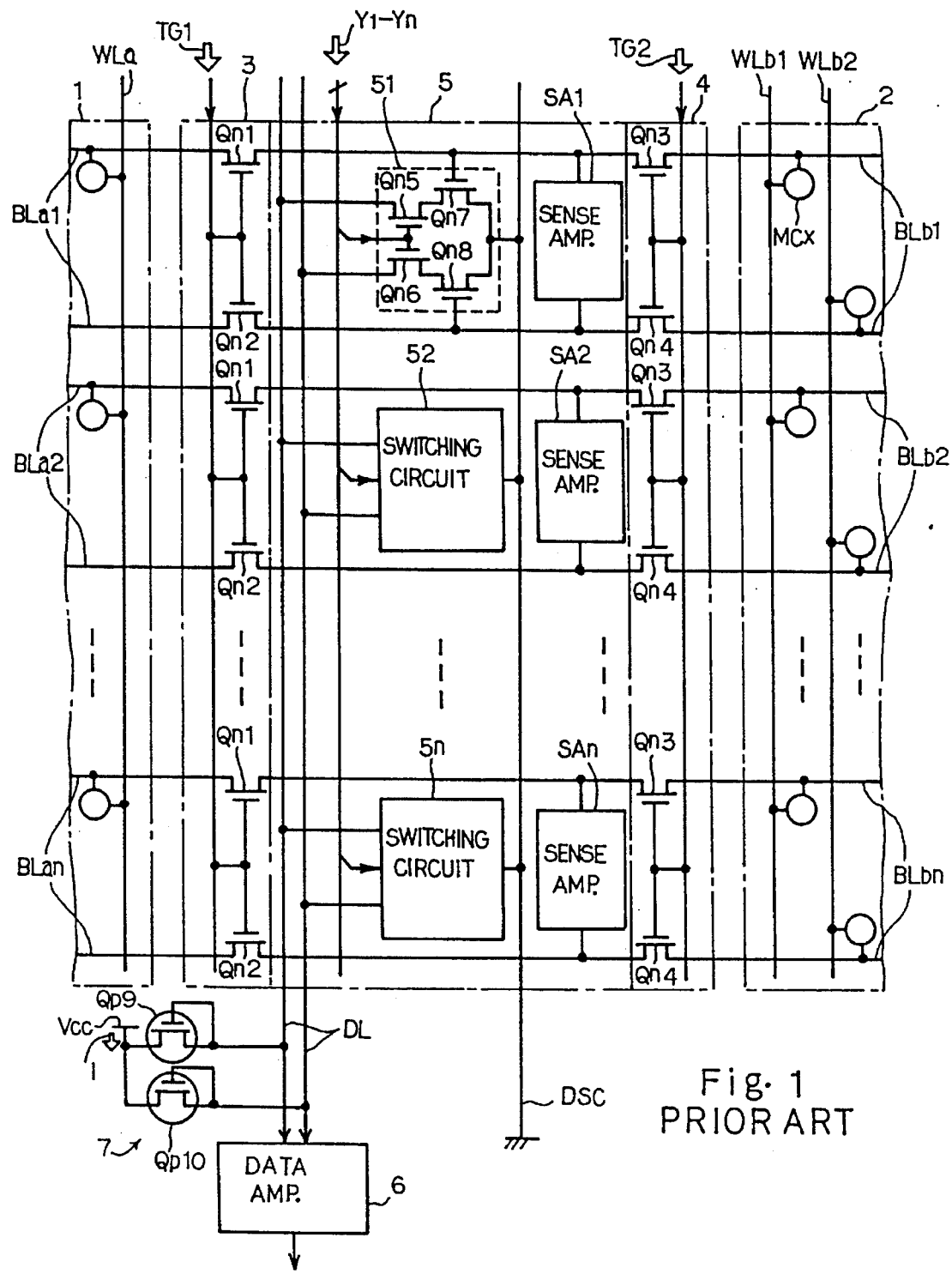
FIG. 1 is a circuit diagram showing the arrangement of the prior art dynamic random access memory device.
Figure 2:
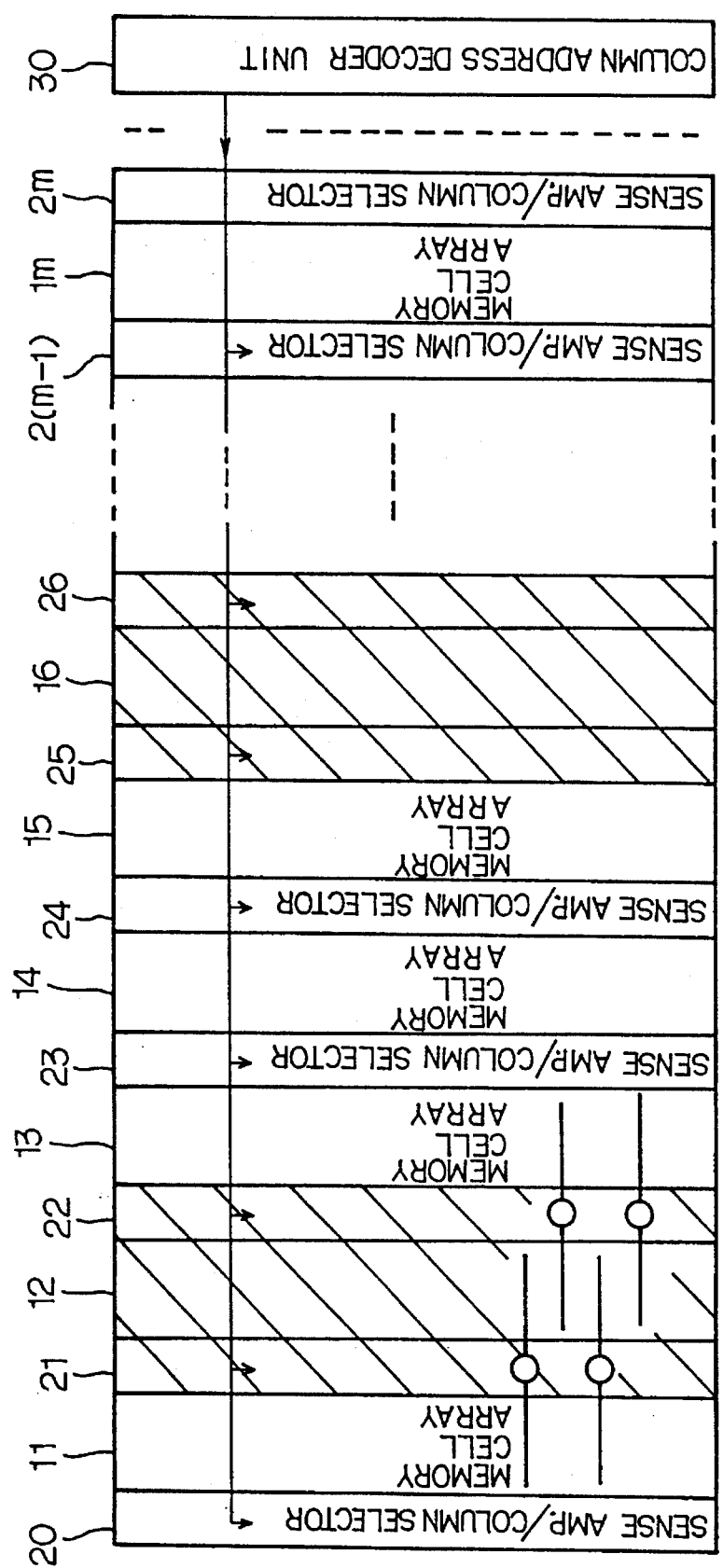
FIG. 2 is a block diagram showing the arrangement of the prior art dynamic random access memory device commercially available.
Figure 3:
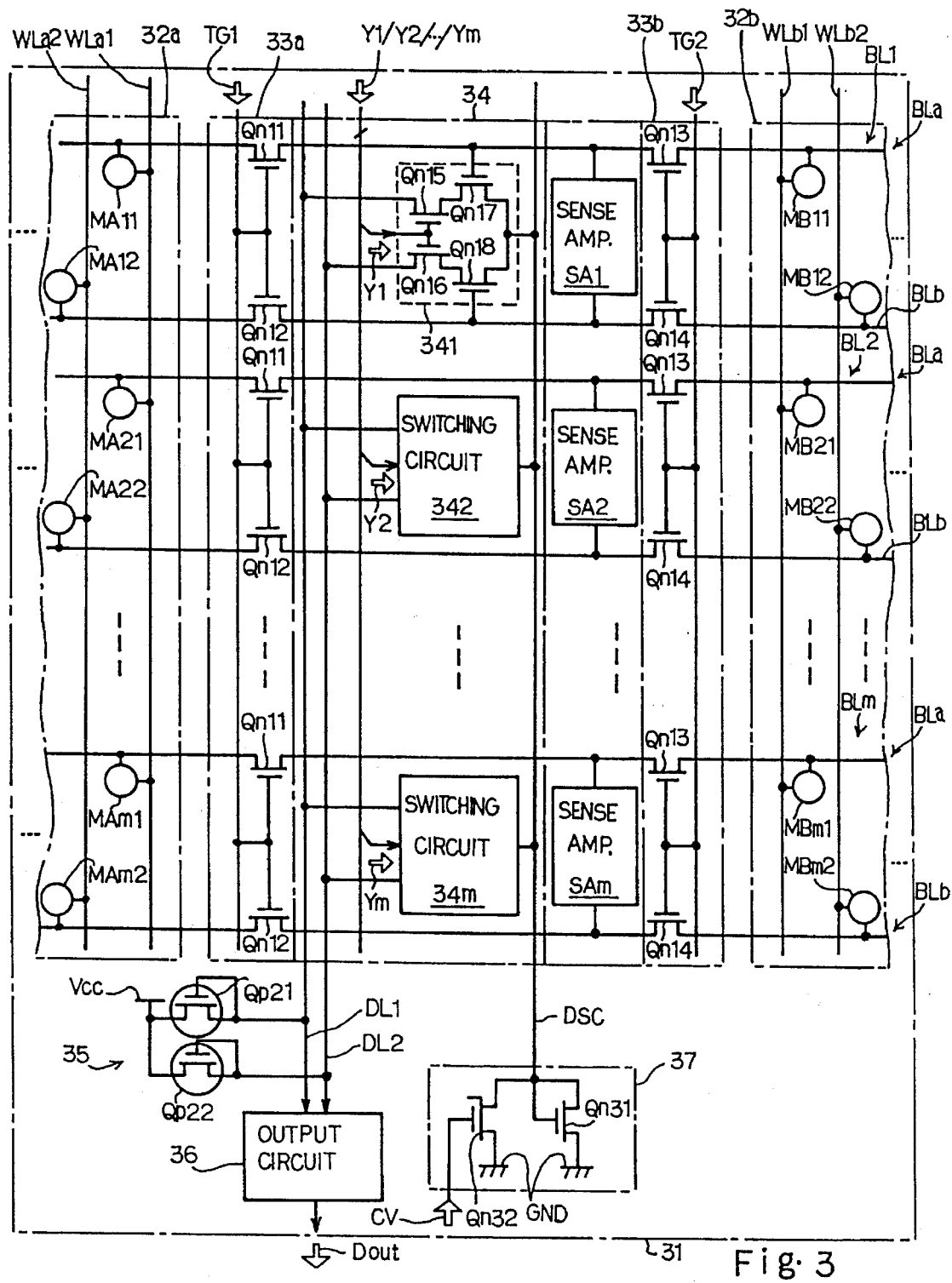
FIG. 3 is a circuit diagram showing the arrangement of a dynamic random access memory device according to the present invention.

Referring to FIG. 3 of the drawings, a dynamic random access memory device embodying the present invention is fabricated on a single semiconductor chip 31, and memory cell arrays 32a and 32b are incorporated in the dynamic random access memory device. The memory cell arrays 32a and 32b are paired with each other for forming an array pair. The memory cell array 32a is implemented by a plurality of memory cells MA11, MA12, . . , MA21, MA22, . . . , MAm1, MAm2, . . . arranged in matrix, and the other memory cell array 32b is also implemented by a plurality of memory cells MB11, MB12, . . . , MB21, MB22, . . . , MBm1, MBm2 arranged in matrix. An n-channel enhancement type switching transistor (not shown) and a storage capacitor (not shown) coupled in series forms each of the memory cells MA11 to MAm2 and MB11 to MBm2. Although more than one array pair is incorporated in the dynamic random access memory device, the other array pairs are not shown in FIG. 3 for the sake of simplicity.

A plurality of bit line pairs BL1, BL2, ... and BLm are shared between the memory cell arrays 32a and 32b, and the bit lines of each pair are labeled with BLa and BLb. Each bit line pair BL1/BL2/BLm is split into a left section, an intermediate section and a right section, and the left sections and the right sections are respectively assigned to the memory cell array 32a and the memory cell array 32b. The lines of memory cells MA11/MA21/MAm1 ..., MA12/MA22/MAm2 ... of the array 32a are alternately coupled to the bit lines BLa and the bit lines BLb, and the bit lines BLa and the bit lines BLb are further coupled to the lines of memory cells MB11/MB21/MBm1 ..., and MB12/MB22/MBm2 ... in the right sections. Thus, the bit line pairs BL1 to BLm are shared between the memory cell arrays 32a and 32b, and data bits are propagated through the left or right sections between the intermediate sections and the memory cell array 32a or 32b in the form of potential difference. Although precharge/balancing circuits are coupled to the left sections and the right sections for balancing the bit line pairs at a precharge level before read-out of the data bits from selected memory cells, the precharge/balancing circuits are not shown in FIG. 3.

The dynamic random access memory device according to the present invention further comprises a plurality sets of word lines WLa1/WLa2 and WLb1/WLb2 respectively associated with the memory cell arrays 32a and 32b for selectively coupling the memory cells MA11 to MAm2 and MB11 to MBm2 to the associated bit lines BLa and BLb. The word lines WLa1 and WLa2 are respectively associated with the lines of memory cells MA11/MA21/MAm1 ..., MA12/MA22/MAm2, ..., and the n-channel enhancement type switching transistors of the memory cells are concurrently gated by the associated word lines WLa1 and WLa2. Similarly, the word lines WLb1 and WLb2 are respectively associated with the lines of memory cells MB11/MB21/MBm1, ... and MB12/MB22/MBm2, ..., and the n-channel enhancement type switching transistors of the memory cells concurrently turn on in the presence of the active high voltage level on the associated word line WLb1 or WLb2. Though not shown in FIG. 3, the word lines WLa1/WLa2 and WLb1/WLb2 are selectively energized by a row-address decoder/word line driver unit.

The dynamic random access memory device further comprises a first transfer gate array 33a coupled between the left sections and the intermediate sections, a second transfer gate array 33b coupled between the right sections and the intermediate sections, an array of sense amplifier circuits SA1, SA2, ... and SAn and a column selector or an array of switching circuits 341, 342, ... and 34m coupled between a pair of data lines DL1/DL2 and a discharging line DSC.

The first transfer gate array 33a has a plurality pairs of n-channel enhancement type switching transistors Qn11/Qn12 coupled between the left sections and the intermediate sections, and the n-channel enhancement type switching transistors Qn11/Qn12 are responsive to a first gate control signal TG1 for electrically connecting the left sections to the intermediate sections.

The second transfer gate array 33b has a plurality pairs of n-channel enhancement type switching transistors Qn13/Qn14 coupled between the right sections and the intermediate sections, and the n-channel enhancement type switching transistors Qn13/Qn14 are concurrently gated by a second gate control signal TG2 for electrically connecting the left sections to the intermediate sections. Though not shown in FIG. 3, the first gate control signal and the second gate control signal are selectively produced by a timing controller, and either memory cell array 32a or 32b becomes accessible.

The sense amplifier circuits SA1 to SAm develop the potential differences on the intermediate sections of the bit line pairs BL1 to BLm through differential amplification so as to rapidly discriminating the logic level of the data bits.

The switching circuits 341 to 34m are similar in circuit arrangement to one another, and each switching circuit comprises a parallel combination of n-channel enhancement type switching transistors Qn15/Qn16 coupled at the source nodes thereof to the data lines DL1 and DL2 and a parallel combination of n-channel enhancement type switching transistors Qn17/Qn18 coupled between the n-channel enhancement type switching transistors Qn15/Qn16 and the discharging line DSC.

The switching circuits 341 to 34m are selectively enabled with column address decoded signals Y1, Y2, ... and Ym, and the n-channel enhancement type switching transistors Qn15/Qn16 of the enabled switching circuit turn on for electrically connecting the data lines DL1 and DL2 to the associated n-channel enhancement type switching transistors Qn17/Qn18.

The switching circuits 341 to 34m are associated with the bit line pairs BL1 to BLm, and the n-channel enhancement type switching transistors Qn17 and Qn18 of each switching circuit are gated by the bit lines BLa and BLb of the associated bit line pair. The bit lines BLa and BLb of each pair propagates a potential difference indicative of a data bit to the associated sense amplifier circuit so that the n-channel enhancement type switching transistors Qn17 and Qn18 selectively turn on and off. One of the n-channel enhancement type switching transistors Qn17 and Qn18 couples the associated data line to the discharging line DSC. However, the other of the n-channel enhancement type switching transistors Qn17 and Qn18 is turned off, and isolates the associated data line from the discharging line. As a result, a potential difference takes place between the data lines DL1 and DL2, and the potential difference on the bit line pair is transferred through the switching circuit to the data lines DL1 and DL2.

The dynamic random access memory device according to the present invention further comprises a charging circuit 35 implemented by a parallel combination of p-channel enhancement type charging transistors Qp21 and Qp22. The p-channel enhancement type charging transistors Qp21 and Qp22 are coupled between a power voltage line Vcc and the data line DL1 and DL2, and the gate electrodes of the p-channel enhancement type charging transistors Qp21 and Qp22 are coupled to the drain nodes thereof. The p-channel enhancement type charging transistors Qp21 and Qp22 thus arranged supply current to the data lines DL1 and DL2, and keep the potential level at the data lines DL1 and DL2 at a certain level lower than the power voltage level by the threshold thereof in so far as the data lines DL1 and DL2 are isolated from the discharging line DSC.

The dynamic random access memory device according to the present invention further comprises an output circuit 36 coupled between the data lines DL1 and DL2 and a data terminal, and the output circuit 36 produces an output data signal Dout from the potential difference on the data lines DL1 and DL2. In this instance, the output circuit 36 serves as an interface. Although a write-in circuit is further incorporated for writing a data bit into one of the memory cells MA11-MAm2 and MB11-MBm2, the write-in circuit is not shown in FIG. 3.

The dynamic random access memory device according to the present invention further comprises a potential control circuit 37 serving as a current control means. The potential control circuit 37 comprises two n-channel enhancement type discharging transistors Qn31 and Qn32 coupled in parallel between the discharging line DSC and a ground line GND.

The gate electrode of the n-channel enhancement type discharging transistor Qn31 is coupled to the discharging line DSC, and the n-channel enhancement type discharging transistor Qn31 is turned on while the discharging line is higher than the threshold thereof. However, if the discharging line DSC reaches the threshold level of the n-channel enhancement type discharging transistor Qn31, the n-channel enhancement type discharging transistor Qn31 turns off, and isolates the discharging line DSC from the ground line GND. Thus, the n-channel enhancement type discharging transistor Qn31 serves as a diode.

A potential control signal CV is supplied to the gate electrode of the n-channel enhancement type discharging transistor Qn32, and is supplied from the timing generator (not shown). The timing generator produces not only the control signals TG1/TG2/CV but also various control signals such as a precharge control signal for the precharging circuits (not shown), an activation signal for the sense amplifier circuits SA1 to SAm and an output enable signal for the output circuit 36.

Figure 4:
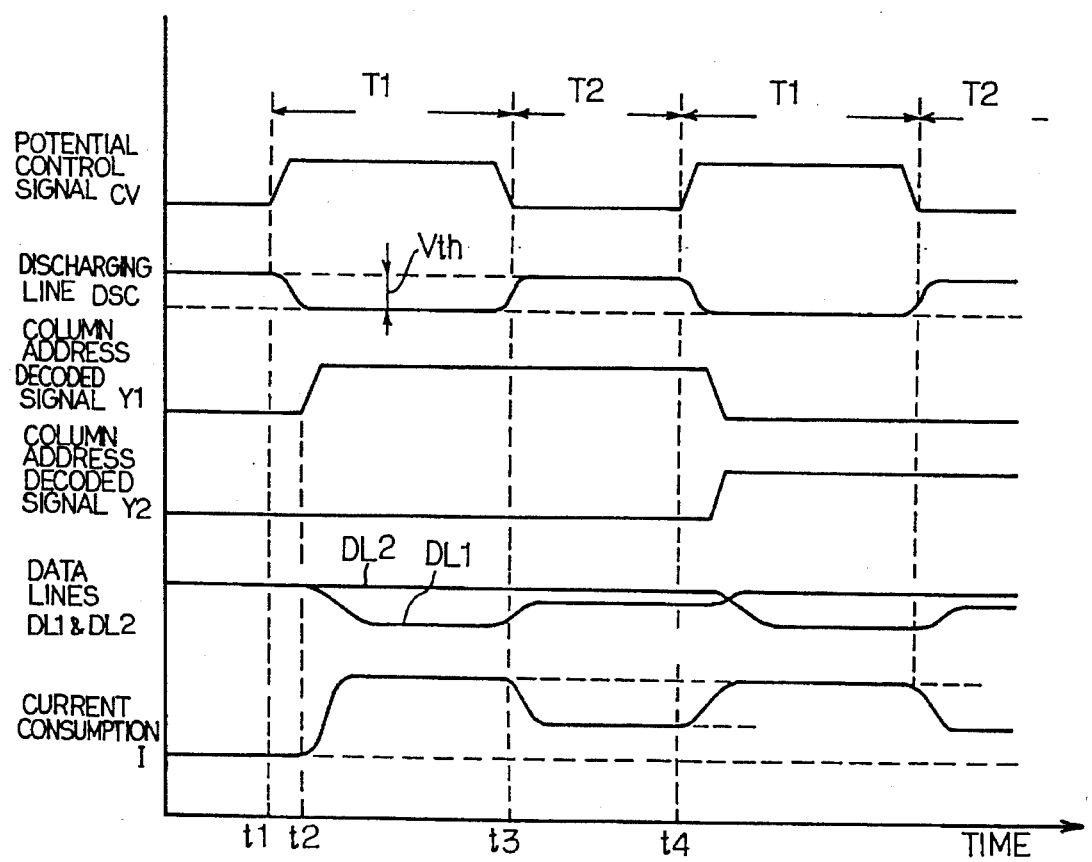
FIG. 4 is a timing chart showing an access to a data bit stored in the dynamic random access memory device.

The dynamic random access memory device thus arranged selectively enters into a read-out phase for a data access, a write-in phase for rewriting the data bits in the memory cells and a refreshing phase for maintaining the data bits in the memory cells. The circuit behaviors in the write-in phase and the refreshing phase are analogous to those of the prior art, and no description is incorporated hereinbelow. For this reason, description on the circuit behavior is focused on the read-out phase with reference to FIG. 4 of the drawings on the assumption that the memory cell MB11 is accessed. Each of the data bits are delivered to the external device through a single access cycle, and each access cycle is divided into the first period T1 and the second period T2.

Although the data bits stored in the memory cell array 32a are simultaneously read out onto the left sections of the bit line pairs BL1 to BLm, no description is made on these data bits for the sake of simplicity.

An external device is assumed to supply address bits indicative of the address assigned to the memory cell MB11, and the first period T1 starts at time t1. The potential control signal CV is changed to the active high voltage level, and the n-channel enhancement type discharging transistor Qn32 turns on so as to pull down the discharging line DSC to the ground voltage level.

The timing generator (not shown) changes the precharge control signal to the active level, and the precharge circuits (not shown) charge and balance the bit lines BLa and BLb. The timing generator keeps the gate control signals TG1 and TG2 in the inactive low voltage level, and the first and second transfer gate arrays 33a and 33b isolate the intermediate sections from the left and right sections.

The row address decoder (not shown) changes the word line WLb1 to the active high voltage level, and the data bits stored in the storage capacitors in the form of electric charges produce potential differences on the right sections of the bit line pairs BL1 to BLm. The timing generator changes the gate control signal TG2 to the active high voltage level, and keeps the other gate control signal TG1 in the inactive low voltage level. As a result, only the right sections are coupled to the intermediate sections, and the potential differences are transferred to the intermediate sections.

The timing generator (not shown) activates the sense amplifier circuits SA1 to SAm, and the sense amplifier circuits SA1 to SAm start to rapidly develop the potential differences transferred from the right sections of the bit line pairs BL1 to BLm.

The charging circuit 35 keeps the data lines DL1 and DL2 at the certain voltage level, and the switching circuits 341 to 34m isolate the data lines DL1 and DL2 from the discharge line DSC. For this reason, the current consumption I of the charging circuit 35 is zero.

The column address decoder (not shown) changes the column address decoded signal Y1 to the active high voltage level at time t2. However, the other column address decoded signals Y2 to Ym are maintained at the inactive low voltage level. The column address decoded signal Y1 allows the n-channel enhancement type switching transistors Qn15/Qn16 of the switching circuit 341 to turn on, and only the switching circuit 341 is enabled. The potential difference on the intermediate section of the bit line pair BL1 causes the n-channel enhancement type switching transistors Qn17 and Qn18 to turn on and off, and the data line DL1 is electrically connected through the n-channel enhancement type switching transistors Qn15 and Qn17 to the discharging line DSC. However, the n-channel enhancement type switching transistor Qn18 isolates the data line DL2 from the discharging line DSC. As a result, the current flows through the switching circuit 341, the discharging line DSC and the n-channel enhancement type discharging transistor Qn32 to the ground line GND, and the potential level on the data line DL1 reaches a voltage level given through a proportional distribution between the on-resistances of the field effect transistors Qp21, Qn15, Qn17 and Qn32. On the other hand, the potential level on the other data line DL2 is maintained, and the potential difference on the bit line pair BL1 is transferred to the data lines DL1 and DL2.

The output circuit 36 produces the output data signal Dout indicative of the data bit stored in the memory cell MB11 from the potential difference between the data lines DL1 and DL2.

Upon production of the output data signal Dout, the access cycle enters into the second period T2 at time t3, and the potential control signal CV is recovered from the high voltage level to the low voltage level. Then, the n-channel enhancement type discharging transistor Qn32 turns off, and the discharging line DSC is recovered to the voltage level higher than the ground voltage level by the threshold Vth of the n-channel enhancement type discharging transistor Qn31. Although the current continuously flows from the data line DL1 through the n-channel enhancement type discharging transistor Qn31 into the ground line GND, the potential level on the data line DL1 is slightly lifted, and the current consumption I is decreased as shown.

The potential control signal CV is maintained at the low voltage level until the next access cycle starts at time t4.

As will be appreciated from the foregoing description, the potential control circuit 37 according to the present invention changes the amount of current flowing into the ground line GND, and the dynamic random access memory device improves the current consumption. The switching circuit is enabled as early as that of the prior art, and the access speed is not prolonged.

Although the particular embodiment of the present invention has been shown and described, it will be obvious to those skilled in the art that various changes and modifications may be made without departing from the spirit and scope of the present invention. For example, the potential control circuit 37 may be replaced with a variable resistor or another appropriate circuit with variable in resistance.

What is claimed is:

1. A semiconductor memory device comprising:
    a) a plurality of addressable memory cells for storing data bits;
    b) a plurality of pairs of first data lines selectively coupled to said plurality of addressable memory cells;
    c) a first addressing system for selectively connecting said plurality of addressable memory cells to said plurality of pairs of first data lines;
    d) second data lines paired with each other;
    e) a charging circuit coupled to said second data lines for supplying current thereto;
    f) a discharging line for discharging said current;
    g) a second addressing system having a plurality of switching circuits coupled in parallel between said second data lines and said discharging line, one of said plurality of switching circuits being responsive to a data bit on one of said plurality of pairs of first data lines for selectively connecting said second data lines to said discharging line, thereby transferring said data bit to said second data lines in the form of potential difference;
    h) an interface responsive to said data bit on said second data lines for producing a data signal; and
    i) a current control means operative to increase the current flowing from said discharging line to a voltage source for enlarging the potential difference between said second data lines before said interface produces said data signal and to decrease said current after completion of the production of said data signal, said current control means including
    i-1) a diode coupled between said discharging line and said voltage source; and
    i-2) a switching transistor coupled between said discharging line and said voltage source in parallel to said diode, and responsive to a control signal so as to provide a current path before said interface produces said data signal, said control signal being changed to an inactive level after said completion of the production of said data signal so that said switching transistor turns off.

2. The semiconductor memory device as set forth in claim 1, in which said diode is implemented by a field effect transistor having a source-to-drain path coupled between said discharging line and said voltage source, a gate electrode of said field effect transistor being coupled to said discharging line.

3. The semiconductor memory device as set forth in claim 1, in which said plurality of addressable memory cells are a random access type for storing the data bits in the form of electric charges.

4. The semiconductor memory device as set forth in claim 3, further comprising
    j) a plurality of sense amplifier circuits respectively associated with said plurality of pairs of first data lines for rapidly developing potential differences indicative of the data bits on said plurality of pairs of first data lines.

5. The semiconductor memory device as set forth in claim 4, in which each of said plurality of pairs of first data lines is split into a first section coupled to first memory cells selected from said plurality of addressable memory cells, a second section coupled to second memory cells selected from said plurality of addressable memory cells and a third section provided between said first section and said second section and coupled to one of said sense amplifier circuits and one of said switching circuits, said semiconductor memory device further comprising:
    k) a first transfer gate array coupled between the first sections of said plurality of pairs of first data lines and the third sections of said plurality of pairs of first data lines, and responsive to a first gate control signal for electrically connecting said first sections to said third sections; and
    l) a second transfer gate array coupled between the second sections and said third sections, and responsive to a second gate control signal for electrically connecting second sections to said third sections, one of said first gate control signal and said second gate control signal being changed to an active level in each data access.

* * * * *